(12) United States Patent
Kumar

(10) Patent No.: US 9,673,840 B2
(45) Date of Patent: Jun. 6, 2017

(54) TURBO PRODUCT CODES FOR NAND FLASH

(71) Applicant: SK hynix memory solutions inc., San Jose, CA (US)

(72) Inventor: Naveen Kumar, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/962,818

(22) Filed: Dec. 8, 2015

(65) Prior Publication Data

US 2016/0164543 A1 Jun. 9, 2016

Related U.S. Application Data

(60) Provisional application No. 62/089,109, filed on Dec. 8, 2014.

(51) Int. Cl.
| | |
|---|---|
| *H03M 13/00* | (2006.01) |
| *H03M 13/29* | (2006.01) |
| *G11C 29/52* | (2006.01) |
| *H03M 13/09* | (2006.01) |
| *H03M 13/15* | (2006.01) |

(52) U.S. Cl.
CPC ... *H03M 13/2963* (2013.01); *H03M 13/2909* (2013.01); *H03M 13/2942* (2013.01); *G11C 29/52* (2013.01); *H03M 13/098* (2013.01); *H03M 13/152* (2013.01)

(58) Field of Classification Search
CPC ......... H03M 13/2963; H03M 13/2909; H03M 13/2942; G11C 29/52
See application file for complete search history.

(56) References Cited

U.S. PATENT DOCUMENTS 8,972,835 B1 * 3/2015 Rahul ................. H03M 13/036
714/800

FOREIGN PATENT DOCUMENTS

KR 1020150084560 7/2015

* cited by examiner

*Primary Examiner* — Sam Rizk
(74) *Attorney, Agent, or Firm* — IP & T Group LLP

(57) ABSTRACT

A method of encoding data in a data block includes generating a first XOR parity from an XOR of all data bits in the data block and an XOR of all row parities of all rows in the data block besides a last row, storing the first XOR parity in the last row, and generating a second XOR parity from an XOR of all column parities of all columns in the data block and an XOR of a parity of the last row.

14 Claims, 8 Drawing Sheets

= ERROR BIT

TURBO PRODUCT CODES FOR NAND FLASH

CROSS-REFERENCE TO RELATED APPLICATIONS

This application claims the benefit of U.S. Provisional Application No. 62/089,109 filed Dec. 8, 2014 entitled "TURBO PRODUCT CODES FOR NAND FLASH", the entire contents of which are incorporated herein by reference.

BACKGROUND

1. Field

Exemplary embodiments of the present disclosure relate to a signal processing and coding technique.

2. Description of the Related Art

Magnetic storage technology was most commonly used for storing data, but the lower weight and faster read/write operations requirements for current electronic devices make the magnetic storage technology less desirable. The NAND-based technology is able to fulfill the demand for high density data storage devices but this technology is costly. There exists a need to lower the cost of NAND-based technology while maintaining performance levels.

SUMMARY

Aspects of the invention include a method of encoding data in a data block. The method may include generating a first XOR parity from an XOR of all data bits in the data block and an XOR of all row parities of all rows in the data block besides a last row; storing the first XOR parity in the last row; and generating a second XOR parity from an XOR of all column parities of all columns in the data block and an XOR of a parity of the last row.

Further aspects of the invention include an apparatus for encoding data in a data block. The apparatus may include an encoder configured to generate a first XOR parity from an XOR of all data bits in the data block and an XOR of all row parities of all rows in the data block besides a last row, store the first XOR parity in the last row and generate a second XOR parity from an XOR of all column parities of all columns in the data block and an XOR of a parity of the last row.

DETAILED DESCRIPTION

Figure 1:
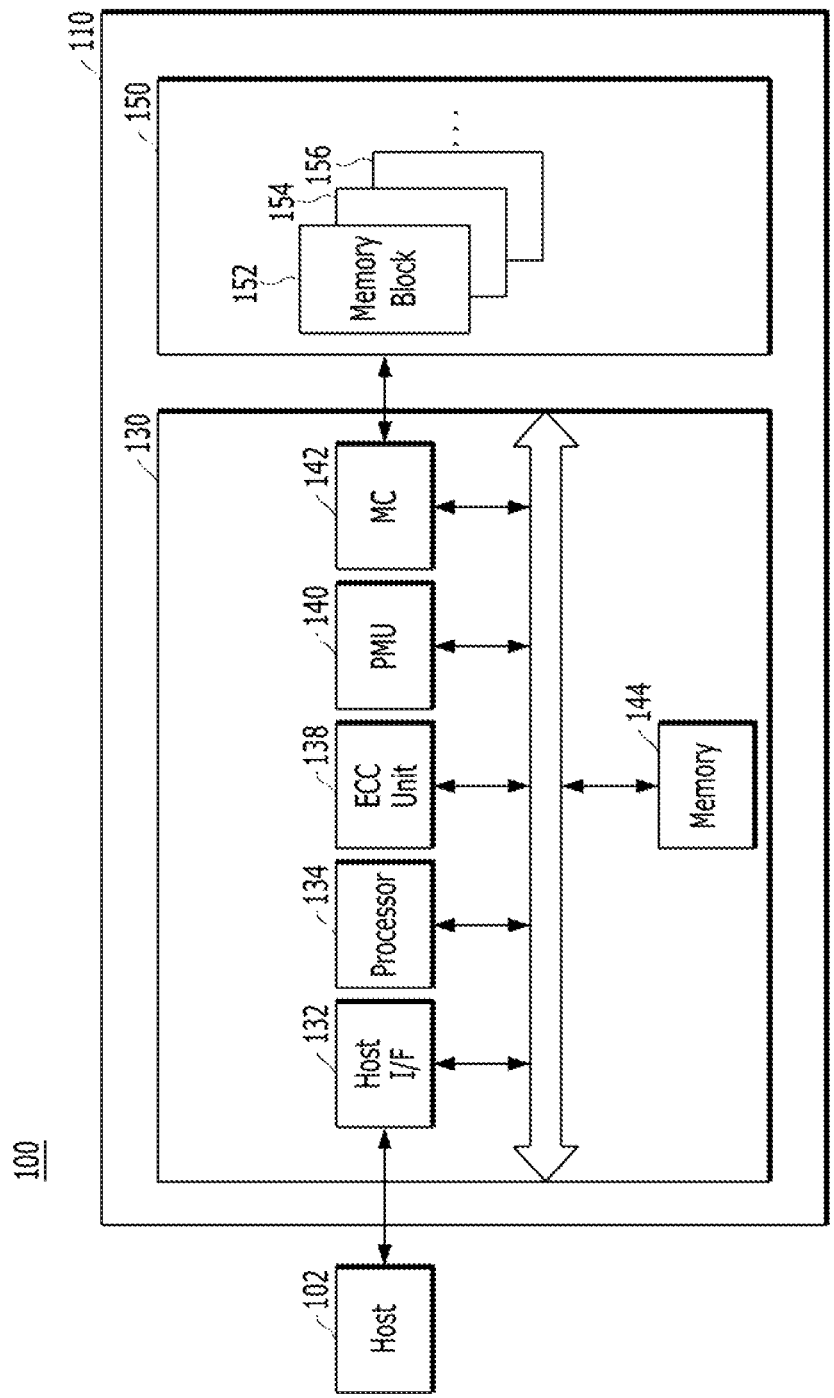
FIG. 1 illustrates a data processing system including a memory system in which embodiments of the present invention are applied.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium, and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

One way to reduce the cost of NAND-based technology involves scaling down the process, but the scaling down process degrades the performance. This performance loss can be compensated by using advanced signal processing and coding techniques. Bose-Chaudhuri-Hocquenghem (BCH) codes and low density parity check (LDPC) codes have been used to ensure the data integrity. For BCH codes, the key drawback is that they cannot be used for soft decision decoding which makes these codes undesirable, LDPC codes provide good hard and soft decision decoding performances. The complexity of the LDPC decoder, however, is quite high, which makes this solution expensive for the hardy implementation. An advanced coding technique which can provide high performance gains with the lower hardware complexity disclosed and described below.

A turbo product code (TPC) is considered as an advanced coding technique which can provide significant gains at much lower hardware complexity compared to LDPC codes. In hard decision decoding, TPC gives significant performance gains compared to BCH and LDPC codes. In soft decision decoding, TPC achieves performance gains close to LDPC codes.

The TPC is considered as an advanced coding technique which can provide significant gains at much lower hardware complexity compared to LDPC codes. In hard decision decoding, TPC gives significant performance gains compared to BCH and LDPC codes. In soft decision decoding TPC achieve performance gains close to LDPC codes.

As a result, there is a need for an advanced coding technique to provide gains in terms of performance and throughput in a system using turbo product codes.

In some embodiments, the present invention will be applied to a data processing system shown in FIG. 1.

FIG. 1 illustrates a data processing system 100 including a memory system in which embodiments of the present invention are applied. The data, processing system 100 shown in FIG. 1 is for illustration only. Other constructions of the data processing system 100 could be used without departing from the scope of this disclosure. Although FIG. 1 illustrates one example of the data processing system 100, various changes may be made to FIG. 1. For example, the data processing system 100 may include any of elements, or may not include any of elements in any suitable arrangement.

Referring to FIG. 1, the data processing system 100 may include a host 102 and a memory system 110.

The host 102 may include, for example, a portable electronic device such as a mobile phone, an MP3 player and a laptop computer or an electronic device such as a desktop computer, a game player, a TV and a projector.

The memory system 110 may operate in response to a request from the host 102, and in particular, s ore data to be accessed by the host 102. In other words, the memory system 110 may be used as a main memory system or an auxiliary memory system of the host 102. The memory system 110 may be implemented with any one of various kinds of storage devices, according to the protocol of a host interface to be electrically coupled with the host 102. The memory system 110 may be implemented with any one of various kinds of storage devices such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device a universal flash storage (UFS) device a compact flash (CF) card, a smart media (SM) card, a memory stick, and so forth.

The storage devices for the memory system 110 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory system 110 may include a memory device 150 which stores data to be accessed by the host 102, and a controller 130 which controls storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as the SSD the operation speed of the host 102 that is electrically coupled with the memory system 110 may be significantly increased.

The controller 130 and the memory device 150 may be integrated into one semiconductor device and configure a memory card. The controller 130 and the memory device 150 may be integrated into one semiconductor device and configure a memory card such as a Personal Computer Memory Card International Association (PCMCIA) card, a compact flash (CF) card, a smart media (SM) card SMC), a memory stick, a multimedia card (MMC), an RS-MMC and a micro-MMC, a secure digital (SD) card, a mini-SD, a micro-SD and an SDHC, and a universal flash storage (UFS) device.

For another instance, the memory system 110 may configure a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network one of various electronic devices configuring a computer network, one of various electronic devices configuring a telematics network, an RFID device, or one of various component elements configuring a computing system.

The memory device 150 of the memory system 110 may retain stored data when power supply is interrupted and, in particular, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a non-volatile memory device, for example, a flash memory. The flash memory may have a three-dimensional (3D) stack structure.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control overall operations of the memory device 150, such as read, write, program and erase operations.

In detail, the controller 130 may include a host interface unit 132, a processor 134, an error correction code (ECC) unit 138, a power management unit (PMU) 140, a memory controller (MC) 142, and a memory 144.

The host interface unit 132 may process commands and data provided from the host 102, and may communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a turbo product code (TPC) a Reed-Solomon (RS) code, a convolution code, recursive systematic code (RSC), a trellis-coded modulation (TCM), a Block coded modulation (BCM), and so on. The ECC unit 138 may include ail circuits, systems or devices for the error correction operation.

The PMU 140 may provide and manage power for the controller 130, that is, power for the component elements included the controller 130.

The MC 142 may serve as a memory interface between the controller 130 and the memory device 150 to allow the controller 130 to control the memory device 150 in response to a request from the host 102. The MC 142 may generate control signals for the memory device 150 and process data under the control of the processor 134. When the memory device 150 is a flash memory such as a NAND flash memory, the MC 142 may generate control signals for the NAND flash memory 150 and process data under the control of the processor 134.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory a data memory, a write buffer, a read buffer a map buffer, and so forth.

The processor 134 may control general operations of the memory system 110, and a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example during the program operation, due to characteristics of a NAND logic function. During the bad block management the data of the program-failed memory block or the bad memory block may be programmed into a new memory block. Also, the bad blocks due to the program fail seriously deteriorates the utilization efficiency of the memory device 150 having a 3D stack structure and the reliability of the memory system 110, and thus reliable bad block management is required.

Figure 2:
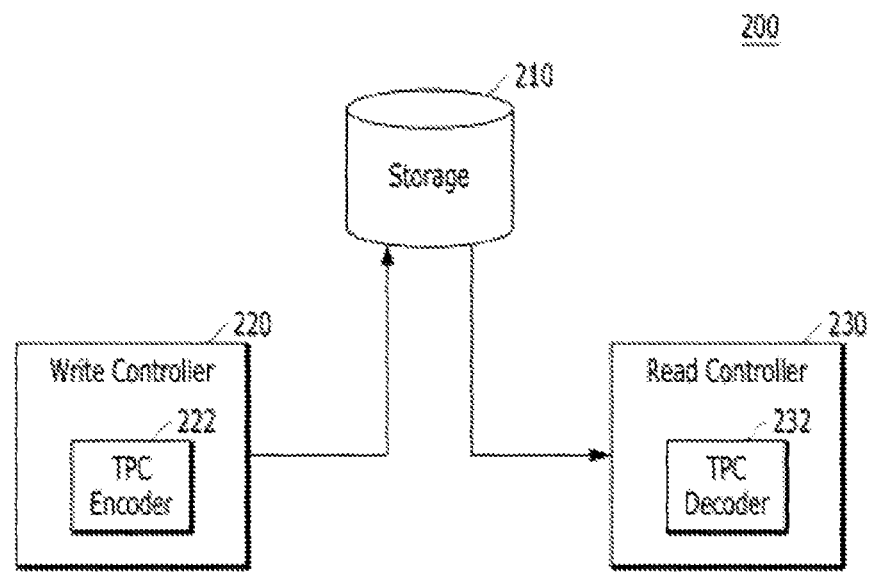
FIG. 2 is a block diagram of a memory system including an encoder and a decoder in accordance with embodiments of the present invention.

FIG. 2 is a block diagram of a memory system 200 including an encoder and a decoder in accordance with embodiments of the present invention. For example, the memory system 200 corresponds to the memory system 110 shown in FIG. 1. For clarity, components of FIG. 1 which are directly related to embodiments of the present invention are not shown herein.

Referring to FIG. 2, the memory system 200 includes a storage 210, a write controller 220 and a read controller 230. For example, the storage 210 corresponds to the memory device 150 shown in FIG. 1, and the write controller 220 and the read controller 230 correspond to the ECC unit 138 shown in FIG. 1.

The storage 210 may include solid state storage such as NAND flash. The write controller 220 receives data, from host 102 in FIG. 1, and processes the data on the storage 210. The read controller 230 reads the data on the storage 210, and processes the data. The write controller 220 includes a TPC encoder 222 and the read controller 230 include a TPC decoder 232 as the components for the TPC scheme, respectively.

As described herein, the TPC code includes $N_r$ row codes and $N_c$ column codes. They are all BCH codes with the following parameters:

Row Codes: $(n_r, k_r, T_r, m_r)$;
Column Codes: $(n_c, k_c, T_c, m_c)$;
XOR Code: $(n_x, k_x, T_x, m_x)$;

where n represents length of the codes, k represents dimension of the codes, T represents error-correction capability of the codes, and m represents finite field-size of the codes. The number of columns combined to generate column parity is specified by $C_\#$, where $C_\#$ is the number of columns combined.

Figure 3:
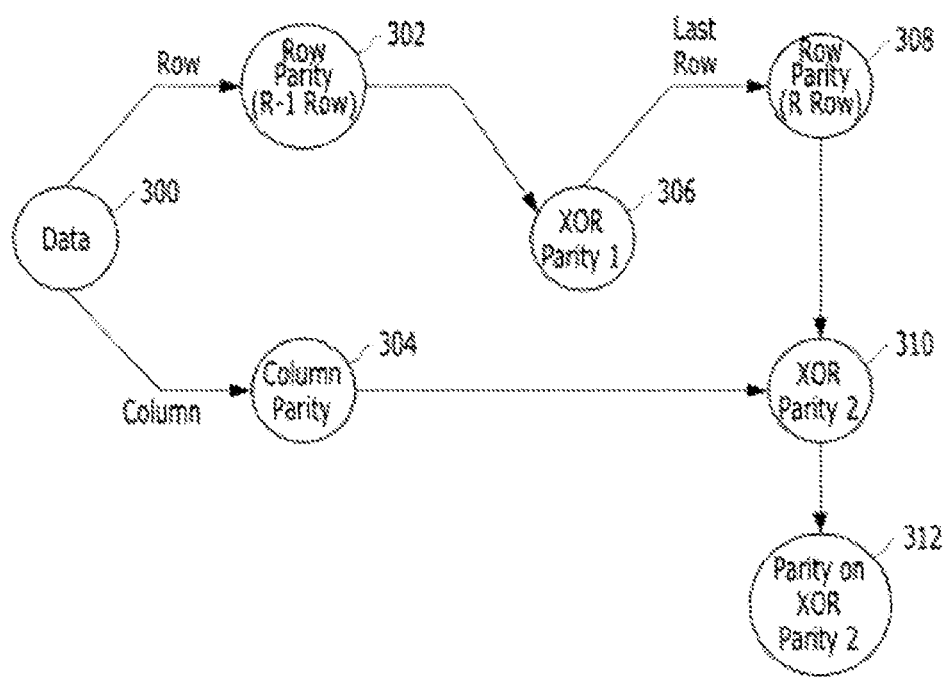
FIG. 3 is a diagram illustrating an encoding process in accordance with aspects of the invention.

FIG. 3 is a flowchart illustrating a TPC encoding scheme in accordance with an embodiment of the present invention.

Figure 4:
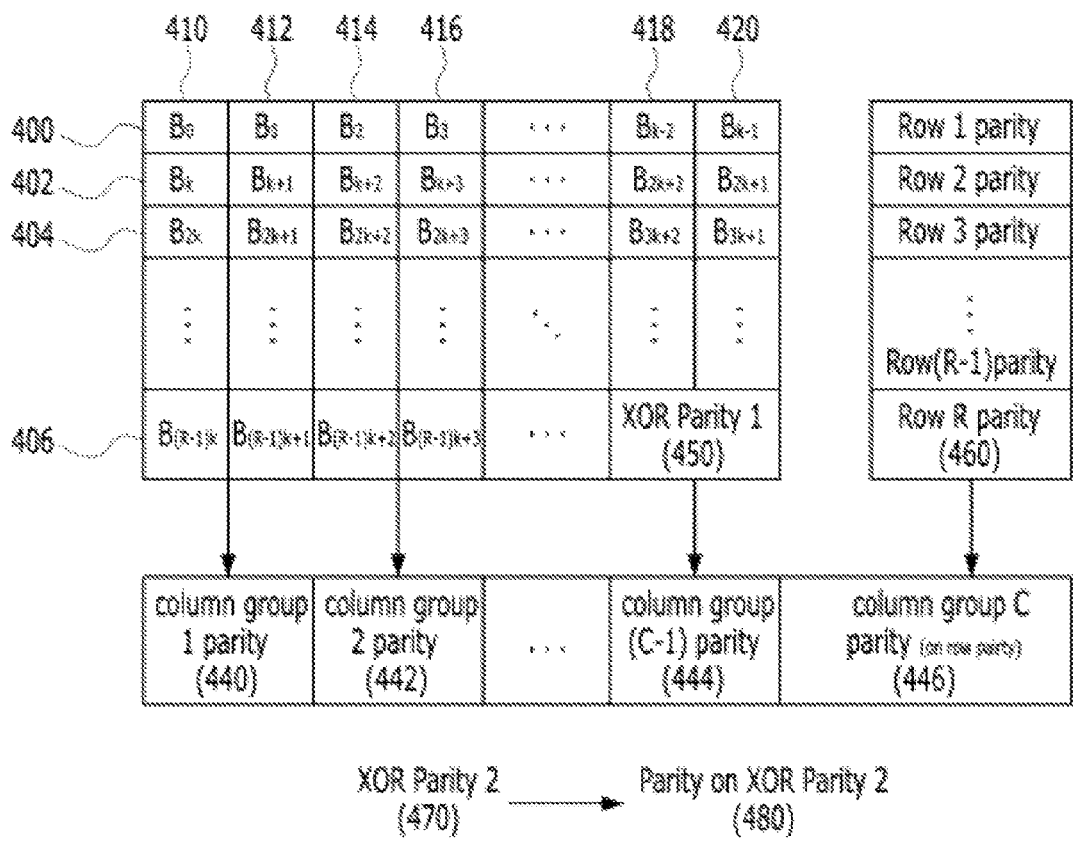
FIG. 4 is a diagram representing an encoding process in accordance with aspects of the invention.

FIG. 4 is a diagram representing an example of a rectangular block of data.

An encoding scheme is described below with reference to FIGS. 3 and 4.

Data 300 may be arranged in a rectangular block (See FIG. 4). The data 300 includes row data and column data. The first rows (rows 1 though R-1) may be encoded with a constituent code. In an embodiment, the first rows are encoded using BCH as the constituent code, although those of skill in the art will understand that the invention is not limited to such selections of constituent code.

The row parities 302 for rows 1 to (R-1) are generated, and the XOR of all data bits and all row parities at this point, all row parities include parities of rows 1 to (R-1)) is taken. The number of XOR bits is given by $C_\#$. Since a row parity will contain $T_r*m_r$ and $T_r*m_r$ will not be an integer multiple of $C_\#$ the row parities may be zero padded to make them an integer multiple of $C_\#$. For example, if row parity length is 42 and $C_\#$ is given as 24, 6 bits can be zero padded to make the row parity 48 bits long and two blocks of length 24 can be constructed from the row parity.

The XOR is taken over the data 300 and the row parities 302, and will be included in the last row 406 of data. This XOR may be identified as XOR parity 1 306, 450. XOR parity 1 306, 450 will have a length of $C_\#$.

The XOR parity 1 (306,450) is included in the last row 406 of data (e.g., row R) and the last row parity (308, 460) is generated. Of note, the last row parity 308, 460) is generated including the XOR parity 1 (306, 450).

The column parities 304 are generated by combining the columns. For a given number of columns C (e.g., $C_\#$), column parities may include column parity 1 440, column parity 2 442, column parity (C-1) 444, and column parity C 446. In examples of this scheme, column parity (C-1) 444 is generated with the inclusion of the XOR parity 1 (450) and column parity C 446 is generated with the inclusion of each of the row parities, which includes row R parity 460 and, as described above, row R parity is generated with the inclusion of XOR parity 1 450. The correction capability (T) and Galois field (m) are assumed to be the same for the row and column parities.

XOR parity 2 310, 470 may be generated by taking an XOR over all the column parities and the last row parity. The length of XOR parity 3 310, 470 is given as $T_r*m_r(=T_c*m_c)$. For simplicity, it is assumed that $T_r*m_r=T_c*m_c$. If $T_r*m_r \neq T_c*m_c$, zero padding may be used to generate the XOR parity 2 310, 470.

Another constituent code may be applied to XOR parity 2 310, 470 whose code parameters are given as $(n_x,k_x,T_x,m_x)$ (e.g., parity on XOR parity 2 312, 480). In general, the Galois field of this BCH code for XOR parity 2 is quite small thus the complexity of encoding/decoding for this code is minimal. It should be noted that this parity of the XOR parity 2 is only written on the NAND. In this way, parity may be saved by not writing XOR parity 2. The parity overhead of this scheme is given as, Total parity for the proposed scheme=$T_r*m_r+T_c*m_c+C_\#+T_x*m_x$ The XOR parity overhead ($C_\#+T_x*m_x$) apart from row and column parities is quite small compared to previously implemented schemes. Thus this scheme has significant performance gains compared to others.

Referring to FIGS. 5-10, various decoding processes for the above disclosed encoding schemes are described. The decoding procedure is similar to regular TPC decoding where row decoding is followed by column decoding in an iterative loop until the data is successfully decoded or the number of iterations exceeds the maximum iteration number. There are certain error patterns which will get stuck in the decoding even if the weight of error patterns is small.

Figure 9A:
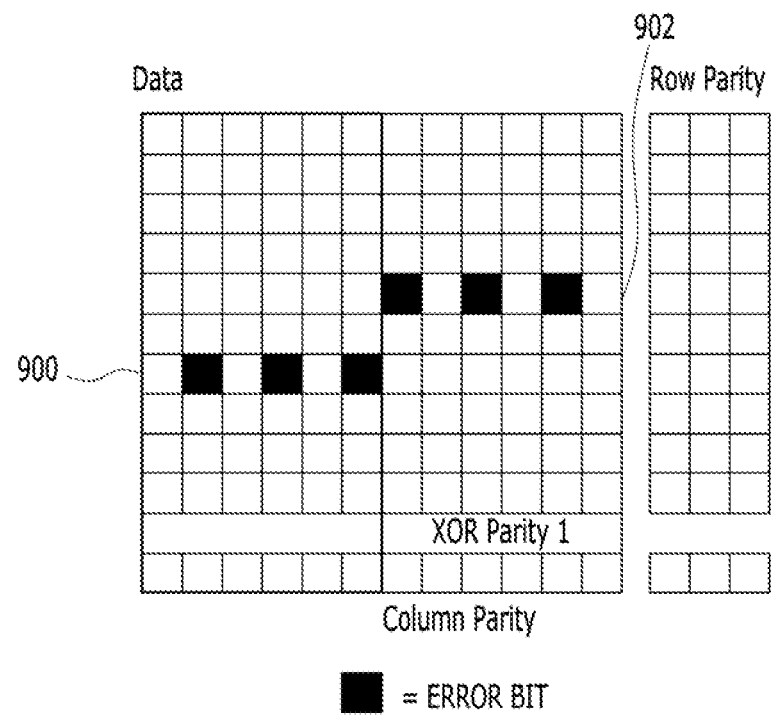
Figure 9B:
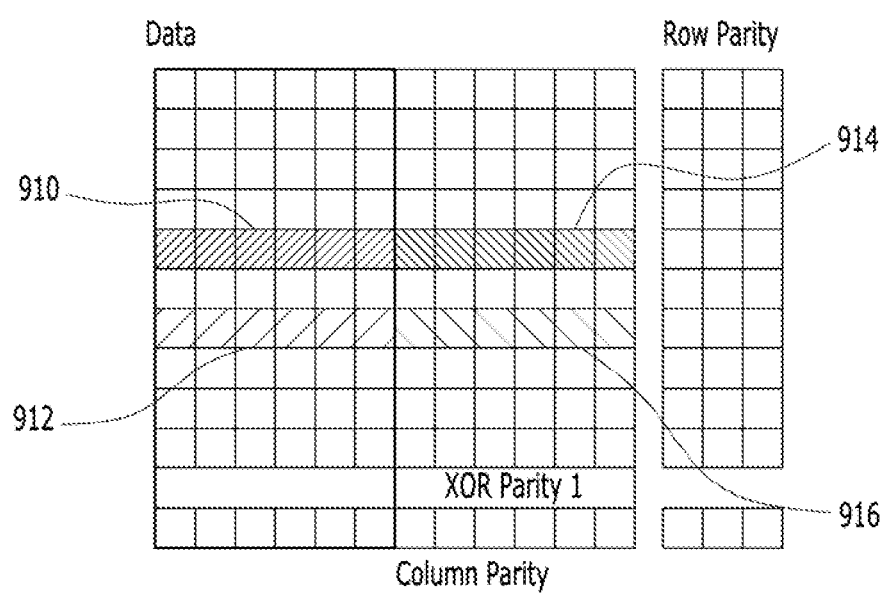
Figure 10:
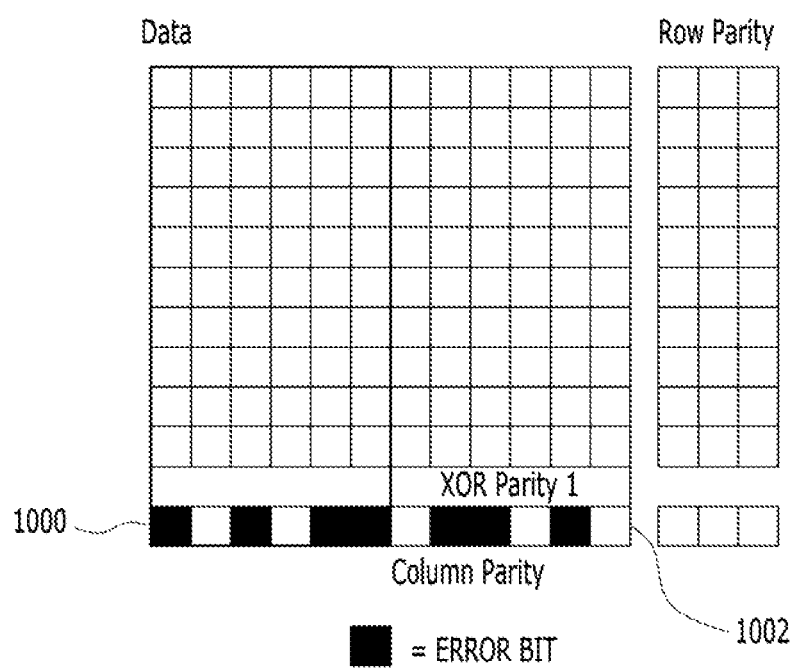

In FIGS. 5-8, (1,1) stuck error patterns are shown. A (1,1) stuck error pattern is a stuck error pattern where there is exactly one row and one column failing. In FIGS. 9A and 9B, (2,2) stuck error patterns are shown, where there are two rows and two columns failing. In FIG. 10, a (0,2) stuck error pattern is shown.

Figure 5:
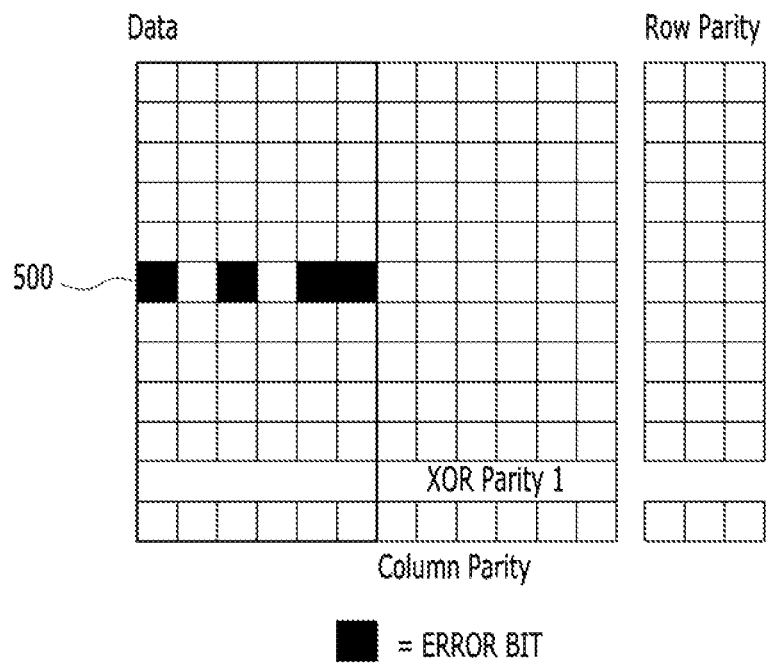
FIGS. 5, 6, 7, 8, 9A, 9B, and 10 are diagrams illustrating stuck error patterns according to aspects of the invention.

In FIG. 5, an error pattern 500 is shown in the data which may get stuck in the decoding. In this example, the correction capability of the row and column code is assumed to be equal to 2. Even though the weight of the error pattern 500 is 4, it will get stuck in the decoding. This error pattern 500 can be corrected using XOR parity 1 450. The row/column intersection is known because the failing row and the failing column are known. First, the XOR is taken of all data, row parities and XOR parity 1 except for the failing row/column intersection. This generated XOR parity can be replaced with the failing row/column intersection which will correct all the error bits in the row/column intersection.

Figure 6:
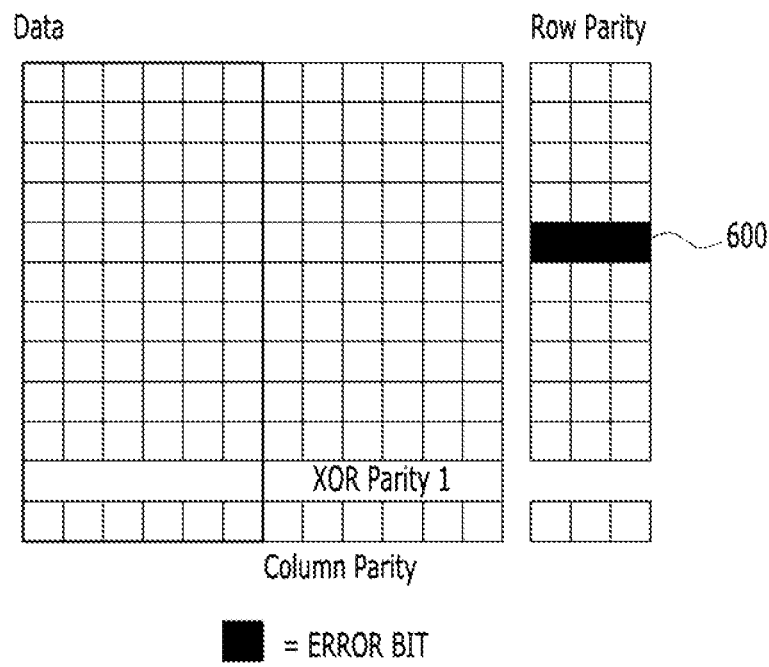

Similarly, in FIG. 6, a stuck error pattern 600 is shown. The stuck error pattern 600 is present in the row parities section. Using the decoding process as described above with respect to FIG. 5, the stuck error pattern 600 may also be corrected.

Figure 7:
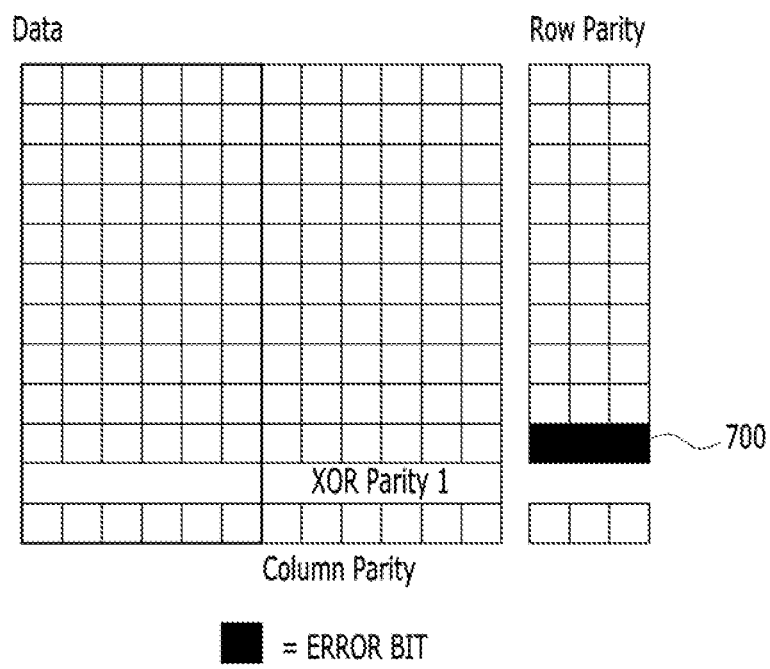

In FIG. 7, a stuck error pattern 700 is shown that is present in the Rth row parity. In order to correct this pattern 700, the XOR parity 2 may be generated at the decoding end which is obtained by taking the XOR of Rth row parity and all column parities. The BCH decoding is run on this XOR parity 2 which will correct all errors because BCH on the XOR parity 2 has a large correction capability. Once the correct XOR parity 2 is obtained, this parity may be used to correct the stuck pattern 700.

Figure 8:
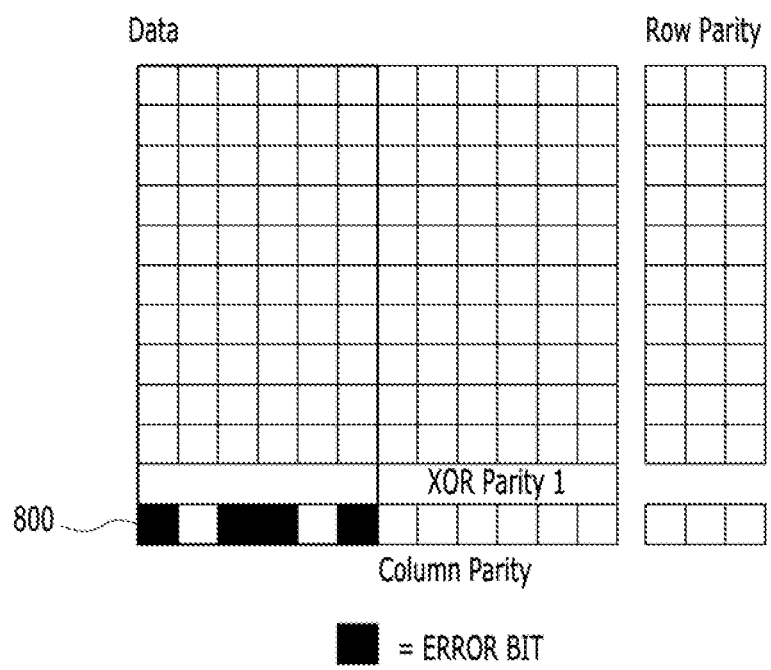

In FIG. 8, a stuck error pattern 800 is shown in the column parity section, which may also be corrected with the process described above with respect to FIG. 7. As such, all (1,1) stuck error patterns present may be decoded in the decoding procedure.

Referring next to FIG. 9A, a (2,2) stuck error pattern is shown. That is, the data includes an error pattern 900 and an error pattern 902. XOR parity 1 and XOR parity 2 cannot be used to correct this stuck error pattern 900, 902. In FIG. 9A, the example where $C_\#$ is equal to 6 is shown for simplicity. The goal is to correct this stuck error pattern 900, 902 by identifying the most probable error locations. Once error locations are known, a simple flipping algorithm may be used to correct this stuck error pattern 900, 902, in FIG. 9A, the stuck error pattern has 6 errors which happen on different locations in the row and column intersection.

As the correct XOR parity 1 is known the XOR of all data and row parities (1 to (R-1) row) can be found and compared with XOR parity 1. XOR parity 1 will differ with these computed XOR parities at most at 6 locations. Now locations of the errors are known, however the exact location of errors in the row/column intersection is not.

As shown in FIG. 9B, in a (2,2) stuck error pattern, there are 4 row/column intersections (910, 912, 914, 916) which might have errors. A bit flipping process (e.g., Chase decoding) may be used, where bits are flopped on the error bit locations determined by the XOR parity 1. In Chase decoding, all 2^flip_bits will be attempted, where flip_bits are a number of bits flipped detected from stored xor and data calculated xor.

In another example of the invention, one bit out of flip_bits (e.g., nchoosek(flip_bits,1)) will be chosen, this bit flip will be attempted at all failed n*m stuck error intersections, and then decoding is attempted. Next, nchoosek (flip_bits,2) on n*m failed stuck error patterns will be attempted, and this process (e.g., nchoosek(flip_bits,flip_bits)) will be repeated on all n*m failed stuck error patterns. All correction must be made inside failed intersection to avoid introducing more errors outside error intersections.

In the first run, a single bit out of the 6 error location bits may be flipped on all 4 row/column failing intersections (910, 912, 914, 916). After one bit flipping, regular decoding can be used on the failing row/column decoding. While decoding, it is ensured that decoded bits during BCH decoding must lie in the row/column failing intersection. In this manner, miscorrections are not introduced in the TPC structure.

In the error pattern shown in FIG. 9A one bit flip in the first row/column intersection is insufficient. A second row/column intersection is then processed with 1 bit flipping, which will decode that row code as well as satisfy column code. Once errors in one row/column intersection are corrected, the stuck error pattern becomes a (1,1) error pattern which can be easily corrected by using XOR parity 1.

This pattern gets decoded with a single bit flip in general if a pattern is not decoded by trying all single bit flips in all failed row/column intersections. Two bits and more bit flips can be tried on failed row/column intersection.

In FIGS. 9A and 9B, the value of $C_\#$ is equal to 6. However, in regular TPC code design, the value of $C_\#$ is larger. In those kind of scenarios, the advantages from the disclosed flipping algorithm will be substantial compared to random bit flipping processes. Unlike random bits flipping, the most probable error locations are known with the help of XOR parity 1 and XOR parity 2, which reduces the complexity of integrating the proposed scheme significantly. The scheme disclosed above can be easily generalized for the (n,n) stuck error pattern where n rows and n columns are failing. However, the complexity will increase if value of n is large. Thus, patterns within hardware complexity are corrected using this proposed scheme.

Referring next to FIG. 10, an alternative error pattern of (0,2) is shown. An alternate way of decoding (0,k) stuck error pattern can also be done for the simplification of decoding. In a (0,k), stuck error pattern (e.g., 1000, 1002), all rows are correct and k columns are failing. This pattern can be corrected using the data which is correct. The correctness of the data is verified through XOR parity 1 and row parities. (k-1) column parities may be generated through the data and the last failed column parity may be generated through XOR parity 2. The corrected kth column parity can be verified from the kth column data. If the parity of kth column data matches with the corrected kth parity, the TPC is declared successfully decoded. The correction capability of XOR parity 2 is not very large thus this procedure can be applied to decode the (0,k) stuck error pattern. The stuck error pattern 1000, 1002 shown in FIG. 10 may be corrected by the scheme described above. In general, the probability of (0,k) occurrence is quite low so the proposed scheme will be used rarely in the decoding.

Although decoding error code patterns of (n,n) and (0,k) are disclosed, the processes de scribed herein may also function to decode error code patterns of (n,m), (m,n), etc.

For further description, decoding of an (n,m) failed pattern where n rows and m columns are failing may be performed as followed. First, the XOR of all data and row parities are calculated and compared with stored parities (e.g., XOR_data). Once the XOR_data is received, it is compared with XOR_stored to find error bit locations. The error bit locations are now known, but where these errors lie in n*m failed intersections needs to be determined. As such, error bits found from above comparisons are taken and these bits are flipped at a particular location in all n*m failed intersection. If the constituent codeword gets decoded and all the corrections are made within failed constituent codewords, the corrections are applied. A further check can be performed if any row codeword is corrected through flipping bit by attempting to correct a corresponding column codeword and make all corrections in failed intersections. These bit flippings can be done taking 1 error bit, 2 error bits, 3 error bits and so on at the same time depending upon the number of unmatched bits from XOR_data and XOR_stored.

Additionally, for (0,k) error patterns, the decoding process may be carried out as followed. If all rows are passing and XOR_stored is matched with the XOR calculated on the data and row parities, 'k' failed column codewords are encoded get the corresponding k column parities. In this case, all errors be in parities, and correctness of parities generated in this way can be confirmed through XOR parity 2.

Performance of the above disclosed scheme was measured and compared with 2K BCH code. The values of the TPC code constructed based on the above disclosed scheme were tested:

Data length=32864.
Allowed Parity=308 bytes.
Row Codes: $(n_r, k_r, T_r, m_r)$=(1310,1266,4,11).
Column Codes: $(n_c, k_c, T_c, m_c)$=(1318,1274,4,11).
$N_r$=26, $N_c$=27 and $C_\#$=49.
Code on XOR parity 2: $(n_x, k_x, T_x, m_x)$=(121, 44, 11, 7).

Figure 11:
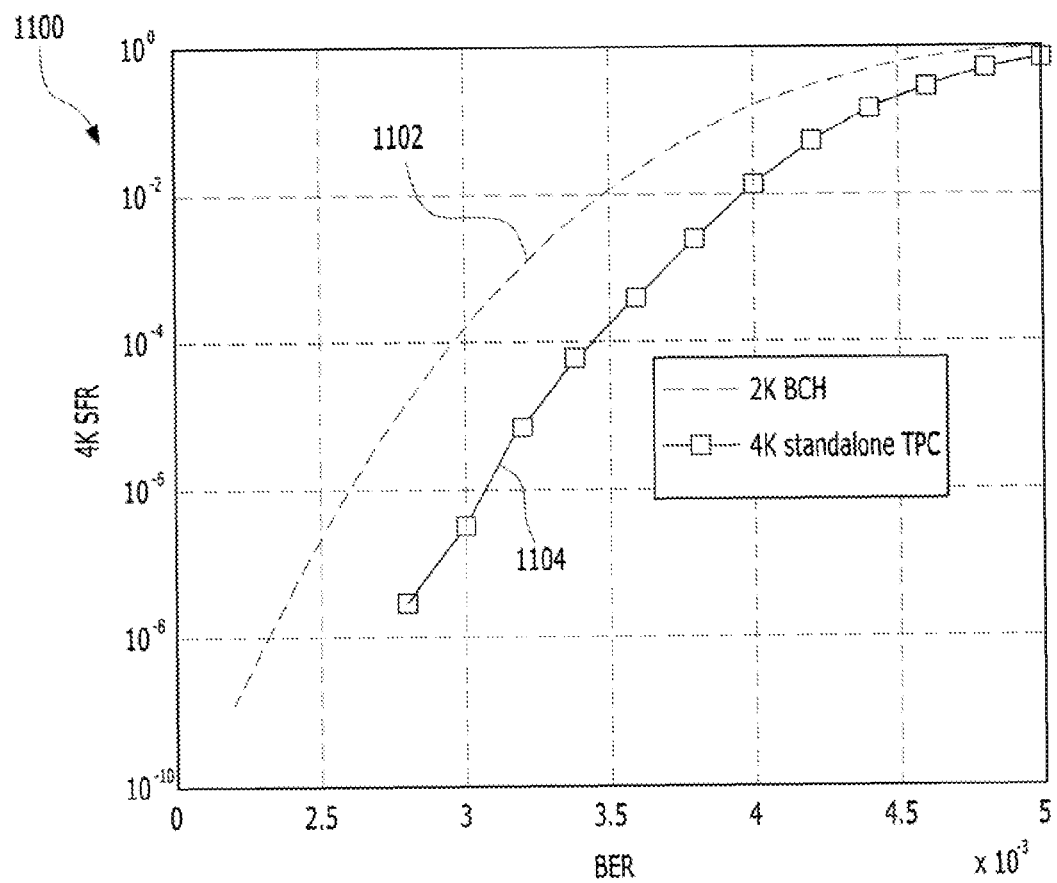
FIG. 11 is a graph illustrating the performance the encoding and decoding scheme according to aspects of the invention.

The performance is shown at FIG. 11. The graph 1100 of FIG. 11 shows the performance of the 2k BCH 1102 and the scheme as described above 1104. An observation in the code design is that a code with Gaois field (m) and correction capability (T) equal to (11,4) with significant shortening bits has been fit. The larger correction capability reduces the miscorrection capability and shortening bits can be used for the miscorrection detection. If there is a bit flipped in shortening bits during BCH decoding, it is known that the BCH decoder has miscorrected the codeword and this miscorrection can avoided in the TPC decoding.

While the present invention has been particularly shown and described with reference to exemplary embodiments thereof, it will be understood by those of ordinary skill in the art that various changes in form and details may be made therein without departing from the spirit and scope of the present invention as defined by the following claims. Thus, the foregoing is by way of example only and is not intended to be limiting. For example, any numbers of elements illustrated and described herein are by way of example only. The present invention is limited only as defined in the following claims and equivalents thereof.

What is claimed is:

1. A method of encoding data in a data block, comprising:
generating a first XOR parity from an XOR of all data bits in the data block and an XOR of all row parities of all rows in the data block besides a last row;
storing the first XOR parity in the last row; and
generating a second XOR parity from an XOR of all column parities of all columns in the data block and an XOR of a parity of the last row.

2. The method of claim 1, further comprising applying a constituent code to the second XOR parity to generate a parity of the second XOR parity.

3. The method of claim 1, further comprising zero padding the row parities such that a length of the row parities is an integer multiple of a number of columns in the data block.

4. The method of claim 1, further comprising decoding a stuck error pattern in the data.

5. The method of claim 4, wherein the decoding step includes:
generating a third XOR parity from the data, row parities, and the first XOR parity except from a failing row/column intersection that includes the stuck error pattern; and
correcting the stuck error pattern by flipping bits in the stuck error pattern based on the generated third XOR parity.

6. The method of claim 4, wherein the decoding step further includes:
determining the row/column intersections in the data block with the stuck error pattern by comparing the first XOR parity with the XOR of all data bits in the data block and the XOR of all parities of all rows in the data block besides the last row; and
determining a location of an error bit in the stuck error pattern by bit-flipping bits in the determined row/column intersections.

7. The method of claim 1, wherein the stuck error pattern is at least one of a (n,m) stuck error pattern or a (0,k) stuck error pattern.

8. An apparatus for encoding data in data block, comprising:
an encoder configured to:
generate a first XOR parity from an XOR of all data bits in the data block and an XOR of all row parities of all rows in the data block besides a last row;
store the first XOR parity in the last row; and
generate a second XOR parity from an XOR of all column parities of all columns in the data block and an XOR of a parity of the last row,
wherein the data is encoded based on the first XOR parity and the second XOR parity.

9. The apparatus of claim 8, wherein the encoder is further configured to apply a constituent code to the second XOR parity to generate a parity of the second XOR parity.

10. The apparatus of claim 8, wherein the encoder is further configured to zero pad the row parities such that a length of the row parities is an integer multiple of a number of columns in the data block.

11. The apparatus of claim 8, further comprising a decoder configured to decode a stuck error pattern in the data.

12. The apparatus of claim 11, wherein the decoder is configured to decode the stuck error pattern by:
   generating a third XOR parity from the data, row parities, and the first XOR parity except from a failing row/column intersection that includes the stuck error pattern; and
   correcting the stuck error pattern by flipping bits in the stuck error pattern based on the generated third XOR parity.

13. The apparatus of claim 11, wherein the decoder is configured to decode the stuck error pattern by:
   determining the row/column intersections in the data block with the stuck error pattern by comparing the first XOR parity with the XOR of all data bits in the data block and the XOR of all parities of all rows in the data block besides the last row; and
   determining a location of an error bit in the stuck error pattern by bit-flipping bits in the determined row/column intersections.

14. The apparatus of claim 8, wherein the stuck error pattern is at least one of a (n,m) stuck error pattern or a (0,k) stuck error pattern.

\* \* \* \* \*